(12) United States Patent　(10) Patent No.:　US 6,345,665 B1
Schulz-Harder　(45) Date of Patent:　Feb. 12, 2002

(54) COOLING SYSTEM

(76) Inventor: Jurgen Schulz-Harder, Hugo-Dietz-Str. 32, D-91207 Lauf (DE)

( * ) Notice: Subject to any disclaimer, the term of this patent is extended or adjusted under 35 U.S.C. 154(b) by 0 days.

(21) Appl. No.: 09/248,323

(22) Filed: Feb. 11, 1999

(30) Foreign Application Priority Data

Apr. 8, 1998 (DE) .......................................... 198 15 817

(51) Int. Cl.[7] ................................................ H05K 7/20
(52) U.S. Cl. ...................... 165/80.4; 257/714; 257/721; 361/690; 361/698; 361/699; 165/80.3
(58) Field of Search ................ 165/80.4, 80.3, 165/908; 257/714, 721; 361/690, 699, 698

(56) References Cited

U.S. PATENT DOCUMENTS

| 4,450,505 A | * | 5/1984 | Mittal et al. ................. 361/699 |
| 5,022,462 A | * | 6/1991 | Flint et al. .................. 165/80.4 |
| 5,078,208 A | * | 1/1992 | Urch ......................... 165/54 X |
| 5,083,194 A | * | 1/1992 | Bartilson ............... 165/80.3 X |
| 5,133,403 A | * | 7/1992 | Yokono et al. ......... 165/80.3 X |
| 5,370,178 A | * | 12/1994 | Agonafer et al. ...... 165/80.3 X |
| 5,768,103 A | * | 6/1998 | Kobrinetz et al. ........... 361/699 |
| 5,987,893 A | * | 11/1999 | Schulz-Harder et al. ... 165/80.4 X |
| 6,014,312 A | * | 1/2000 | Schulz-Harder et al. ..... 361/699 |

FOREIGN PATENT DOCUMENTS

| DE | 25 54 906 | | 6/1977 | |
| DE | 4421 025 | | 12/1995 | |
| DE | 44 29 760 | | 2/1996 | |
| GB | 2360068 | * | 10/1975 | ................... 165/54 |
| JP | 3-29397 | * | 2/1991 | ................... 361/699 |

* cited by examiner

Primary Examiner—Leonard Leo
(74) Attorney, Agent, or Firm—Hoffman, Wasson & Gitler

(57) ABSTRACT

The invention pertains to a new type of cooling system for cooling of heat sources, especially for cooling of electric components, with a cooler comprising, on a housing through which a coolant can flow, at least one first cooling surface that can be splashed with the coolant and at least one second cooling surface for flange-mounting of the heat source.

14 Claims, 3 Drawing Sheets

COOLING SYSTEM

FIELD OF THE INVENTION

The invention refers to a cooling system for cooling of electric components or circuits with at least one cooler possessing a housing through which a coolant can flow and at least one first cooling surface that can be splashed with the coolant as well as at least one second cooling surface for flange mounting or fastening of at least one electric component or circuit.

BACKGROUND OF THE INVENTION

A very wide variety of cooling facilities or systems are known for cooling of electric components and/or circuits, for example systems that use natural air convection, or for higher capacities, systems in which cooling occurs by means of an air stream produced by a ventilator or fan.

For very high capacities, cooling systems are also known that have a cooler through which a liquid coolant flows (EP 0 611 235). Although these watercooled cooling systems enable a high cooling capacity, they have the disadvantage, among other things, that the coolant must be recooled, that corrosion or sealing problems occur, as well as problems caused by the electrical conductivity of the coolant. Moreover, with these water-cooled cooling systems it is necessary that the cooler and the heat exchanger for recooling are compatible.

SUMMARY OF THE INVENTION

The object of the invention is to provide for a cooling system that avoids these disadvantages of the prior art.

For this purpose a cooling system for cooling of electric components or circuits or modules is provided with at least one cooler possessing a housing through which a coolant can flow and comprises at least one first cooling surface that can be splashed with the coolant as well as at least one second cooling surface for mounting or fastening of at least one electric component or circuit. The coolant is compressed air and/or a gas under pressure. Means are provided for injecting water in the form of fine droplets or a fine spray into the coolant, wherein the effective size or surface area of the first cooling surface is at least 2.5 times as great as the effective surface of the second cooling surface.

In a preferred embodiment the coolant into which the water is injected has a relative humidity of less than 90 percent, i.e. before the injection of the water.

It has been shown that by injecting water droplets into the air or gas stream used as a coolant, a high cooling capacity can be achieved despite the use of this coolant (air or gas stream), among other things, precisely due to the fact that especially the thermal resistance of the transfer between cooler and coolant is reduced significantly, indeed as much as 50 percent in comparison with cooling purely be means of a gas stream and/or air stream.

The invention has the additional advantage that at the same cooling capacity only a notably reduced quantity of gaseous coolant (cool air and/or cool gas) is necessary. Whereas for example a flow rate of at least 30–40 m/sec is necessary for cooling purely with air or gas, the flow rate can be reduced to 5 m/sec at a cooling system according to the present invention with a cooler of the same size and the same dissipating capacity.

DETAILED DESCRIPTION OF THE DRAWINGS

Additional embodiments of the invention are the subject of the subclaims. The invention now is explained by way of examples in the following in more detail with reference to the figures.

Figure 1:
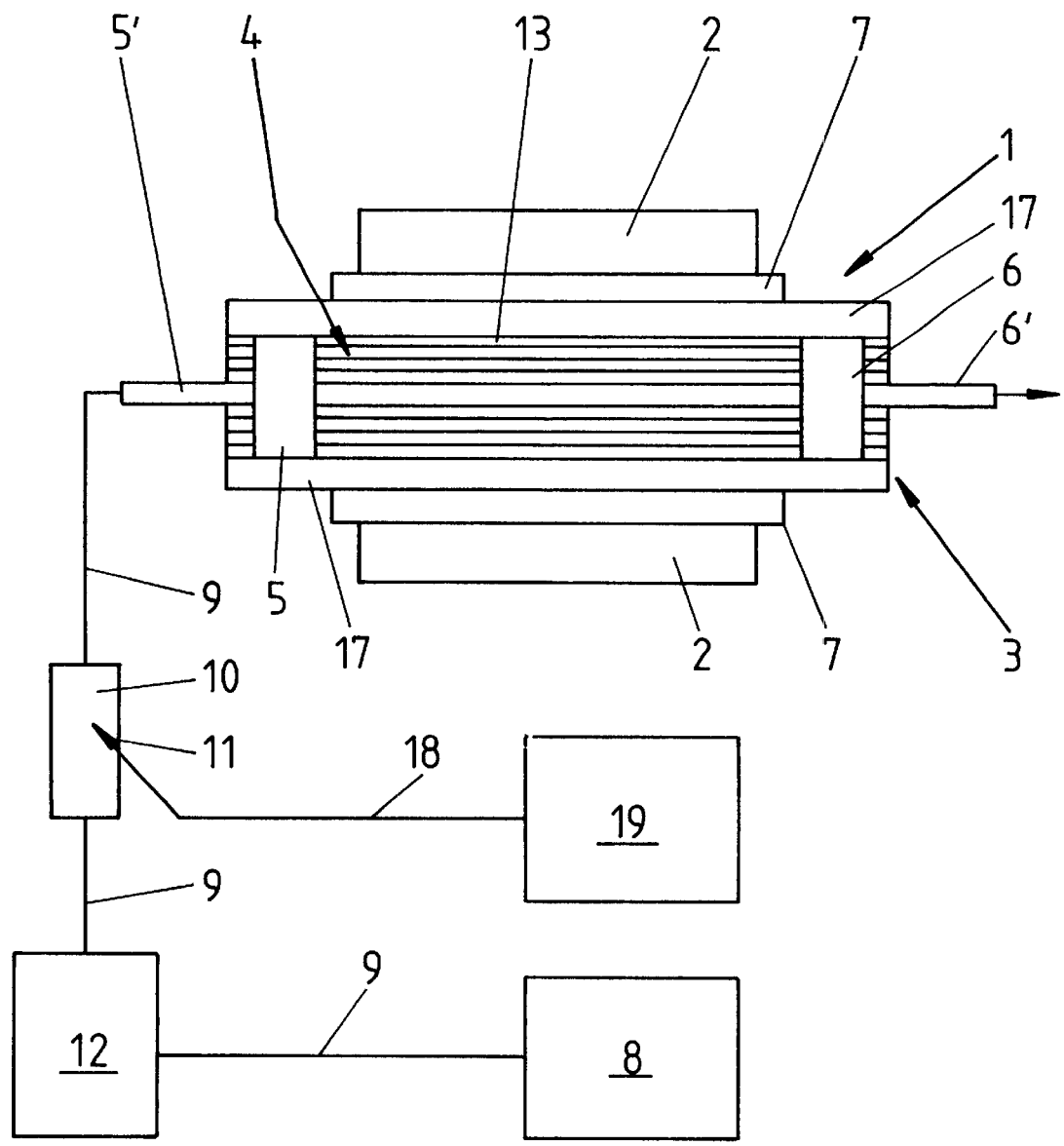
FIG. 1 is simplified functional depiction, a first possible embodiment of a cooling system according to the present invention.

In FIG. 1, a cooler in general is designated by 1 serving as a heat sink for cooling of electric power components 2, for example power semiconductor switching circuits or components. The cooler 1 consists of a housing 3 made of metal, for example of copper, in which a many-branched cooling channel system 4 comprising a multitude of reversals provided between a first collection chamber 5 and a second collection chamber 6 in such a way that a coolant delivered by way of collection chamber 5 flows through the cooling channel system 4 and can be released or can emerge by way of the collection chamber 6.

In the depicted embodiment power components 2 are provided for on the top and bottom respectively of the block-shaped housing 3, electrically isolated by a ceramic layer 7, said layer being for example, an element (substrate) of the component 2. The ceramic coatings or layers 7 are tightly connected, e.g. by gluing, soldering etc., with the top or bottom of the housing 3.

The many-branched cooling channel system 4 is designed or structured in such a way that this system forms an inner cooling surface that is in contact with the coolant and that is greater than the outer cooling surface of the housing 3 or of the cooler 1. In the depicted embodiment this outer cooling surface is equal to the surface occupied by the respective component 2 or the ceramic coating 7. Thus the size of the inner cooling surface is at least 2.5 times as great as the size of the outer cooling surface.

In the depicted embodiment, compressed air serves as the coolant and is delivered by a compressor 8 which is connected to the dispersion chamber 5 or to the connection 5' located there by means of a connection 9 (e.g. conduit or hose). In the connection 9 a mixing chamber 10 is formed, in which water in the form of fine droplets or spray is injected into the air stream produced by the compressor 8, precisely by means of a suitable jet or jet configuration 11 in the form of a fog consisting of finely dispersed water droplets.

The compressed air imbued with water droplets in this way then flows from the collection chamber 5 through the cooling channel system 4, enters into the collection chamber 6 and is released from there by way of an outlet 6' into the air. Principally, the embodiment can also be constructed in such a way that the collection chamber 6 already forms the outlet, i.e. that the housing 3 has the largest possible outlet opening. The stream of compressed air delivered by the compressor 8 is adjusted in such a way that the pressure at the inlet of the cooler 1, i.e. at the collection chamber 5 located there, amounts to at least one bar and the air flows through the cooler 1 at a minimum speed of 5 m/sec. The quantity of water injected into the air stream by means of the jet configuration 11 is controlled in dependence on the power dissipation or loss to be dissipated from the components 2 by means of the cooler 1, just in such a way that the injected water quantity amounts to at least 0.1 liter per hour and kW of power dissipation.

The dispersion of the water at the jet configuration 11 occurs for example by means of ultrasound or by means of ultrasonically operated dispersion jets and/or by means of high-pressure jets, i.e. for example in that the water emerges into the compressed air stream under very high pressure on at least one fine jet aperture. The compressed air delivered by the compressor 8 has the lowest possible relative humidity, i.e. a relative humidity of less than 90 percent in any case. For this purpose it can be useful to provide an air-dryer 12 between the compressor 8 and the mixing chamber 10, for example a cooler with a moisture trap.

Figure 2:
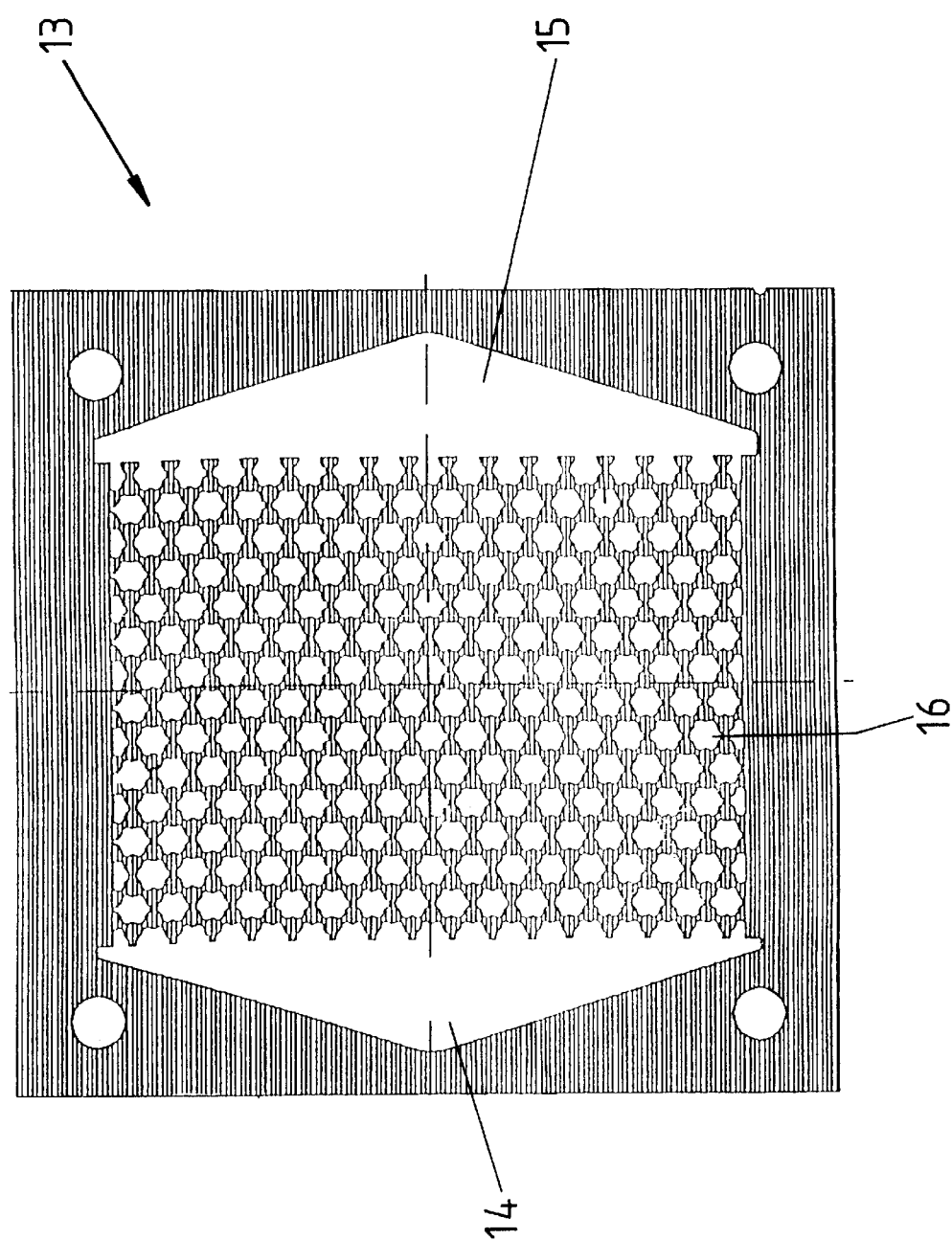
FIG. 2 is simplified top view, a plate of the housing of the cooler in FIG. 1.

The cooler 1 consists of several layers or plates 13 that are arranged one above the other in a stack and connected to each other on their surfaces and structured according to FIG. 2, with two larger apertures 14 and 15 respectively, each of which is positioned in the stack congruently with an aperture 14 or 15 of the adjacent plate 13 and which in this way form the collection chambers 5 and 6. Between the apertures 15 and 16 each plate 13 has a sieve-like structure, i.e. it is provided with a multitude of small apertures 16. These are arranged and formed in such a way that the cooling channel system 4 is obtained through the apertures 16 between the collection chambers 5 and 6. On the top and bottom of the cooler 1 respectively, one plate is provided for without the apertures 14–16. The plates 13 and 13' are metal plates, for example those made of copper, and are connected to each other by means of soldering or active soldering or by use of the DCB-method (direct copper bonding— known, for example, from US-PS 37 44 120). The connections 5' and 6' on the collection chambers 5 and 6 are attached after fabrication of the housing. The jet configuration 11 is connected by means of a conduit 18 to a source 19 that delivers the water which is under pressure.

Figure 3:
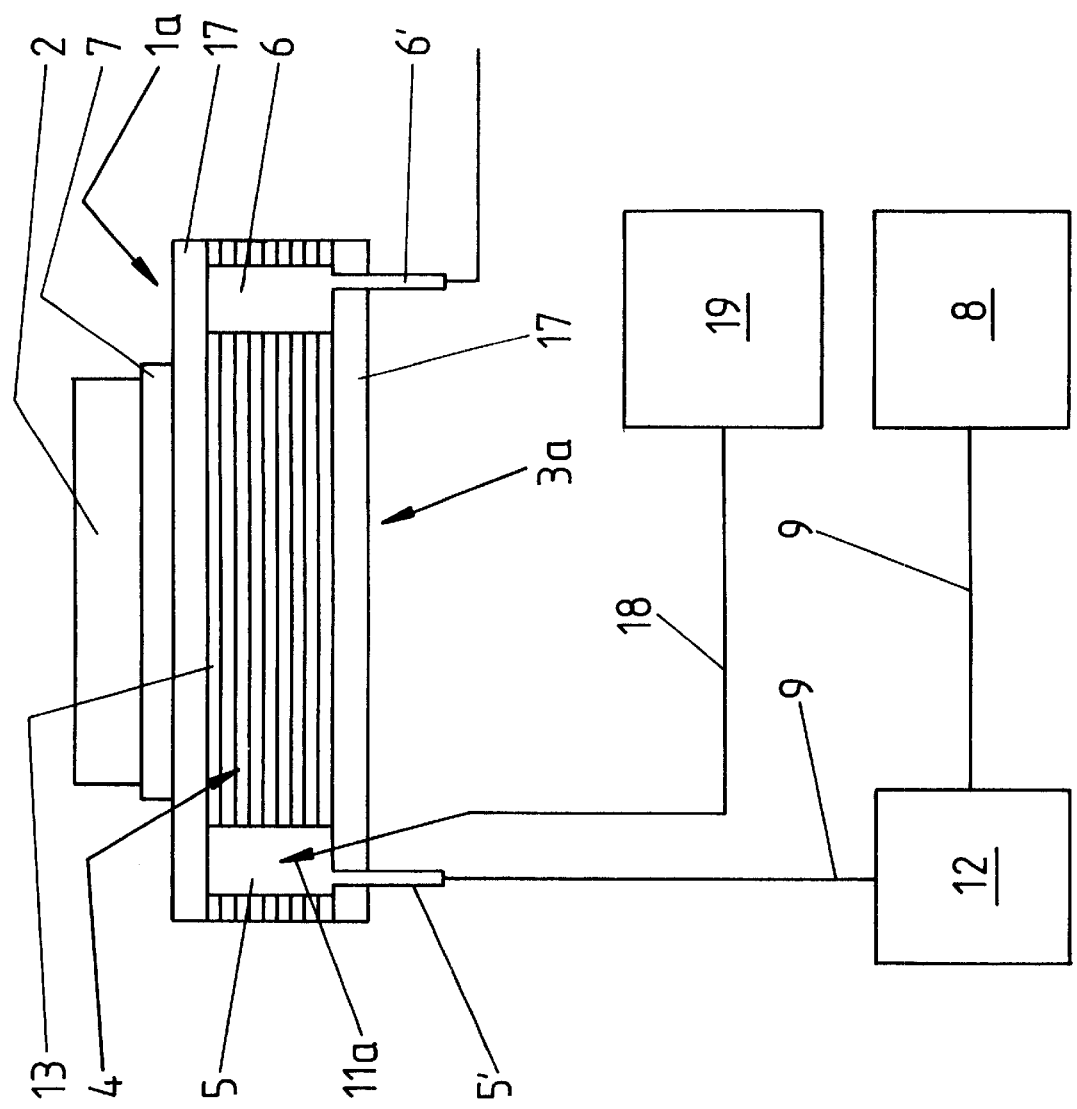
FIG. 3 is a depiction similar to FIG. 1 of a further embodiment of the system according to the present invention.

FIG. 3 shows an embodiment that differs from the embodiment of FIG. 1 among other things in that the connections 5' and 6' are provided on the bottom of the housing 3a. Moreover, a jet configuration 11a corresponding to the jet configuration 11 is provided for in the collection chamber 5. The injection of the water into the dried air takes place in this embodiment directly in the collection chamber 5. The corresponding connections are likewise located on the bottom of the housing 3a, on which (bottom) no component 2 is intended in this embodiment.

The invention was described in the foregoing with examples of embodiments. Of course, numerous alterations and modifications are possible, without abandoning the underlying object of the invention.

List of reference marks

| | |
|---|---|
| 1, 1a | cooler |
| 2 | electric power component |
| 3, 3a | cooler housing |
| 4 | cooling channel system |
| 5, 6 | collection chamber |
| 5', 6' | collection chamber connection |
| 7 | ceramic coating or substrate |
| 8 | compressor |
| 9 | connection |
| 10 | mixing chamber |
| 11, 11a | jet configuration |
| 12 | air-dryer |
| 13 | plate |
| 14–16 | aperture |
| 17 | plate |
| 18 | conduit |
| 19 | source |

What is claimed is:

1. A cooling system for cooling of electric components or circuits, comprising:

at least one cooler with a housing having an inlet, an outlet and an interior formed by a branched cooling channel system through which a coolant can flow from said inlet to said outlet, said cooler formed by several plates of metal arranged one above the other in a stack, said plates connected to each other on their surfaces and having apertures forming said branched cooling channels, at least one first cooling surface that can be splashed with the coolant in said interior and with at least one second cooling surface on an outer side of the housing for mounting or fastening of at least one electric component or circuit, the effective surface of the first cooling surface is at least 2.5 times as great as the effective surface of the second cooling surface; wherein the coolant is compressed air or gas under pressure or mixtures thereof, means for injecting water in the form of fine droplets into the coolant, and said means for injecting the water is formed by a chamber spaced apart from the housing of the cooler and connected by at least one connection to the inlet of the housing.

2. The cooling system according to claim 1, wherein the coolant into which the water is injected has a relative humidity of less than 90 percent.

3. The cooling system according to claim 1, further comprising an air-dryer provided in the direction of flow of the coolant before the means for injecting the water.

4. The cooling system according to claim 1, wherein the housing contains at least one cooling channel system which form the first cooling surface and through which the coolant can flow, and that the second cooling surface is provided on an outside of the housing.

5. The cooling system according to claim 1, wherein the coolant is an inert gas under pressure.

6. The cooling system according to claim 5, wherein the inert gas is nitrogen.

7. The cooling system according to claim 1, wherein the coolant is delivered to an intake of the cooler at a pressure of at least one bar.

8. The cooling system according to claim 1, wherein the coolant flows through the cooler at a speed of at least 5 m/sec.

9. The cooling system according to claim 1, further comprising a compressor for producing air pressure that is to serve as a coolant.

10. The cooling system according to claim 1, wherein the means for injecting the water contains at least one ultrasonic spray apparatus, at least one ultrasonic spray diffuse, at least one high-pressure jet, or a combination thereof.

11. The cooling system according to claim 1, further comprising means of regulating the quantity of injected water in dependence on the cooling capacity.

12. A cooling system according to claim 1, wherein the plates of metals are structured such that they form material sections in between the apertures which sections are joined to one another and which sections always abut one another continuously from plate to plate and form continuous columns extending in between one side of the cooler provided with the first cooling surface and to another cooler side opposite to the first cooler side.

13. A cooling system for cooling of electric components or circuits, comprising at least one cooler with a housing having an inlet, an outlet and an interior formed by a branched cooling channel system through which a coolant can flow from said inlet to said outlet, said cooler formed by several plates of metal arranged one above the other in a stack, said plates connected to each other on their surfaces and having apertures forming said branched cooling channels with at least one first cooling surface that can be splashed with the coolant in the interior and at least one second cooling surface on an outer side of the housing for mounting or fastening of at least one electric component or circuit, an effective surface of the first cooling surface is at least 2.5 times as great as an effective surface of the second cooling surface; wherein the coolant is compressed air or gas under pressure, or mixtures thereof, means for injecting water in the form of fine droplets into the coolant, the coolant into which the water is injected has a relative humidity of less than 90 percent, and said means for injecting the water is formed by a chamber spaced apart from the housing of the cooler and being connected by at least one connection to the inlet of the housing.

14. A cooling system according to claim 13, wherein the plates of metals are structured such that they form material sections in between the apertures which sections are joined to one another and which sections always abut one another continuously from plate to plate and form continuous columns extending in between one side of the cooler provided with the first cooling surface and to another cooler side opposite to the first cooler side.

* * * * *